United States Patent
Chien et al.

(10) Patent No.: US 10,600,906 B1
(45) Date of Patent: Mar. 24, 2020

(54) SEMICONDUCTOR DEVICES AND METHODS FOR FORMING THE SAME

(71) Applicant: VANGUARD INTERNATIONAL SEMICONDUCTOR CORPORATION, Hsinchu (TW)

(72) Inventors: Chung-Yen Chien, Taoyuan (TW); Sheng-Wei Fu, Taoyuan (TW); Chung-Yeh Lee, Hsinchu County (TW)

(73) Assignee: VANGUARD INTERNATIONAL SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 16/676,755

(22) Filed: Nov. 7, 2019

Related U.S. Application Data

(62) Division of application No. 16/007,169, filed on Jun. 13, 2018, now Pat. No. 10,510,878.

(51) Int. Cl.
*H01L 21/00* (2006.01)
*H01L 29/78* (2006.01)
*H01L 29/66* (2006.01)
*H01L 29/40* (2006.01)
*H01L 21/321* (2006.01)
(Continued)

(52) U.S. Cl.
CPC ...... *H01L 29/7813* (2013.01); *H01L 21/3212* (2013.01); *H01L 21/32133* (2013.01); *H01L 21/765* (2013.01); *H01L 29/407* (2013.01); *H01L 29/66734* (2013.01)

(58) Field of Classification Search
CPC ............... H01L 29/7813; H01L 29/407; H01L 29/66734
See application file for complete search history.

(56) References Cited

U.S. PATENT DOCUMENTS 7,345,342 B2  3/2008  Challa et al.
8,053,315 B2 * 11/2011  Tai ................... H01L 29/7813
                                                                438/270
8,610,205 B2  12/2013  Probst
(Continued)

FOREIGN PATENT DOCUMENTS

CN      105895516 A    8/2016
TW      201010080 A1   3/2010

OTHER PUBLICATIONS

Taiwanese Office Action and Search Report, dated Jun. 7, 2018, for Taiwanese Application No. 107103438.

*Primary Examiner* — Nicholas J Tobergte
(74) *Attorney, Agent, or Firm* — Birch, Stewart, Kolasch & Birch, LLP

(57) ABSTRACT

A method for forming a semiconductor device is provided. A plurality of trenches are formed in the substrate. An isolation oxide layer is formed in the trenches and on the substrate. A shield polysilicon is deposited in the trenches and on the isolation oxide layer on the substrate. A first etching process is performed to remove a first portion of the shield polysilicon. A first removal process is performed to remove a first portion of the isolation oxide layer. A second etching process is performed to remove a second portion of the shield polysilicon. A second removal process is performed to remove a second portion of the isolation oxide layer. An inter-poly oxide layer is formed on the remaining shield polysilicon and the remaining isolation oxide layer, wherein the inter-poly oxide layer has a concave top surface.

10 Claims, 5 Drawing Sheets

(51) Int. Cl.
*H01L 21/3213* (2006.01)
*H01L 21/765* (2006.01)

(56) References Cited

U.S. PATENT DOCUMENTS

| | | |
|---|---|---|
| 9,000,514 B2 | 4/2015 | Lee et al. |
| 9,245,963 B2 | 1/2016 | Burke et al. |
| 9,425,305 B2 * | 8/2016 | Terrill .................. H01L 29/407 |
| 10,038,089 B2 | 7/2018 | Hu et al. |
| 2004/0089910 A1 | 5/2004 | Hirler et al. |
| 2010/0006928 A1 | 1/2010 | Pan et al. |
| 2019/0067427 A1 | 2/2019 | Burke et al. |

\* cited by examiner

SEMICONDUCTOR DEVICES AND METHODS FOR FORMING THE SAME

CROSS REFERENCE

This application is a Divisional of U.S. application Ser. No. 16/007,169, filed on Jun. 13, 2018, the entirety of which is incorporated by reference herein.

BACKGROUND OF THE INVENTION

Field of the Invention

The present invention relates to a semiconductor device and a method for forming the same, and in particular it relates to a semiconductor device which is able to reduce gate-to-drain capacitance (Cgd) and suppress gate leakage current and a method for forming the same.

Description of the Related Art

The semiconductor integrated circuit (IC) industry has undergone a period of rapid development. Technological advances in integrated circuit materials and designs have produced many generations of integrated circuits. Each generation of integrated circuits has smaller and more complex circuits than previous generations of integrated circuits.

In a split-gate trench metal-oxide-semiconductor field-effect transistor (MOSFET) device, gate-to-drain capacitance (Cgd) can be reduced by applying a shield gate trench (SGT) structure to increase the switching speed of the element. The shield polysilicon in the shield gate trench is electrically connected to the source, so that the trench gate polysilicon is electrically insulated from the drain. The gate polysilicon and the shield polysilicon are electrically insulated from each other by the inter-poly oxide (IPO) located therebetween.

However, as component sizes continue to shrink, backfill oxides are used as inter-layer oxides (IPOs) to insulate the gate polysilicon and the shield polysilicon during the manufacturing process of the split-gate trench MOSFET devices. Due to the limited aspect ratio of the trenches during backfilling the oxide, the ability to control the thickness and quality of inter-poly oxides is limited, resulting in problems of high gate-to-source leakage current. In addition, the ability of the shield gate trench (SGT) structures to reduce the gate-to-drain capacitance (Cgd) is also limited.

Therefore, in this technical field, an improved split-gate trench MOSFET and a method for forming the same is needed.

BRIEF SUMMARY OF THE INVENTION

An embodiment of the present invention provides a method for forming a semiconductor device. The method includes providing a substrate, forming a plurality of trenches in the substrate, forming an isolation oxide layer in the trenches and on the substrate, depositing a shield polysilicon in the trenches and on the isolation oxide layer on the substrate, performing a first etching process to remove a first portion of the shield polysilicon and expose a portion of the surface of the isolation oxide layer in the trenches, performing a first removal process to remove a first portion of the isolation oxide layer, performing a second etching process to remove a second portion of the shield polysilicon and expose another portion of the surface of the isolation oxide layer in the trenches; performing a second removal process to remove a second portion of the isolation oxide layer; and forming an inter-poly oxide layer on the remaining shield polysilicon and the remaining isolation oxide layer, wherein the inter-poly oxide layer has a concave top surface.

Another embodiment of the present invention provides a semiconductor device. The semiconductor device includes a substrate, including a plurality of trenches; an isolation oxide layer, disposed in the trenches; a shield polysilicon, disposed in the trenches and partially surrounded by the isolation oxide layer; and an inter-poly oxide layer, disposed on the isolation oxide layer and the shield polysilicon; wherein the inter-poly oxide layer has a concave top surface.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

Figure 1:
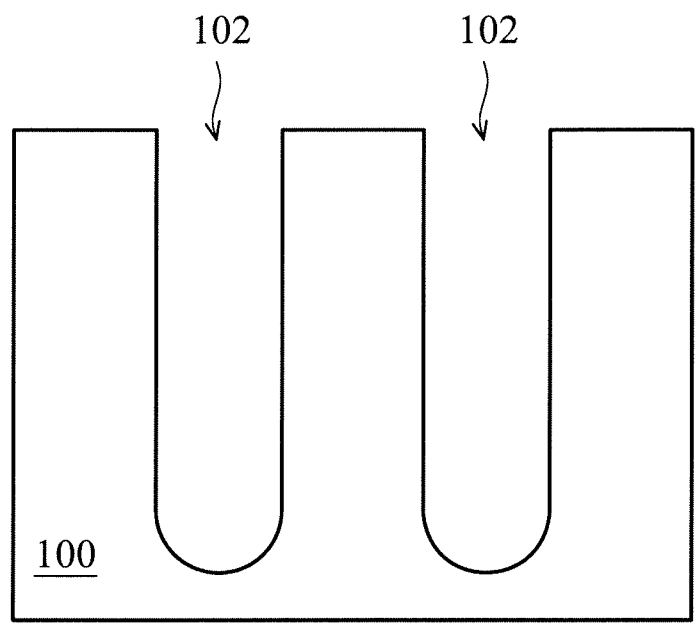
FIG. 1 illustrates a schematic cross-sectional view of a semiconductor device during the process according to one embodiment of the present invention.

The invention provides various embodiments to illustrate the technical features of the present invention. In the present invention, specific components and arrangements are described for simplicity. However, the present invention is not limited to these embodiments. For example, the formation of a first component on a second component in the description may include embodiments in which the first and second components are formed in direct contact, and may also include embodiments in which additional components may be formed between the first and second components, such that the first and second components may not be in direct contact. In addition, for the purpose of simplicity and clarity, the present invention may repeat reference numerals and/or letters in the various examples. However, it does not in itself dictate a specific relationship between the various embodiments and/or configurations discussed. It should be emphasized that according to industrial standard operations, each component may not be drawn to scale. In fact, the dimensions of the various elements may be arbitrarily expanded or reduced for clarity of discussion.

As used herein, the singular forms "a," "an" and "the" are intended to include the plural forms as well, unless the context clearly indicates otherwise. It will be further understood that the terms "comprises" and/or "comprising,"— when used in this specification, specify the presence of stated features, steps, operations, elements, and/or components, but do not preclude the presence or addition of one or more other features, steps, operations, elements, components, and/or groups thereof.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

The following describes some embodiments of the present invention. FIG. 1 to FIG. 10 are schematic cross-sectional views of a semiconductor device 10 during various stages in the process according to some embodiments of the present invention. Additional operations can be provided before, during, and/or after the stages described in FIG. 1 to FIG. 10. In various embodiments, some of the foregoing operations may be moved, deleted, or replaced. Additional features can be added to the semiconductor device. In different embodiments, some of the features described below may be moved, deleted, or replaced.

The embodiments of the invention provide a semiconductor device and a method for forming the same. In some embodiments of the present invention, the above semiconductor device is a split-gate trench MOSFET device. The present invention improves the process, performs a two-step etching process on a shield polysilicon, and performs a two-stage removal process on an isolation oxide layer to mitigate the degree of recess of the isolation oxides generated between the trench sidewalls and the shield polysilicon sidewalls during the past processes, such that the inter-layer oxide (inter-poly oxide) filled in the subsequent process does not generate (or substantially does not generate) voids, thereby enhancing the control ability to the thickness and quality of the inter-layer oxide layer to achieve the purpose of suppressing the gate leakage current.

One embodiment of the present invention provides a method of manufacturing a semiconductor device. As shown in FIG. 1, according to some embodiments, a substrate 100 is provided. In some embodiments, the substrate 100 may be a bulk semiconductor substrate, such as a semiconductor wafer. For example, substrate 100 is a silicon wafer. The substrate 100 may include silicon or other elemental semiconductor material, such as germanium. In some embodiments, the substrate 100 may include a sapphire substrate, a silicon substrate, or a silicon carbide substrate. In some embodiments, the substrate 100 may include one or more layers of a semiconductor material, an insulator material, a conductive material, or a combination thereof. For example, the substrate 100 may be formed of at least one semiconductor material selected from the group consisting of Si, Ge, SiGe, GaP, GaAs, SiC, SiGeC, InAs, and InP. In another embodiment, the substrate 100 may also include a silicon on insulator (SOI). The SOI substrate may be formed using an oxygen implanted isolation (SIMOX) process, a wafer bonding process, other applicable methods, or a combination thereof. In another embodiment, the substrate 100 may also be composed of multiple layers of materials, such as Si/SiGe, Si/SiC. In another embodiment, the substrate 100 may include an insulator material such as an organic insulator, an inorganic insulator, or a combination thereof to form one or more layers. In another embodiment, the substrate 100 may also include a conductive material, such as a polysilicon, a metal, an alloy, or a combination thereof to form one or more layers.

As shown in FIG. 1, according to some embodiments, a plurality of trenches (or grooves) 102 are formed in the substrate 100. In some embodiments, the trenches 102 may be formed using, for example, one or more lithography and etching processes. It should be understood that the size, shape, and location of the trench 102 shown in FIG. 1 are only illustrative and not intended to limit the present invention.

Figure 2:
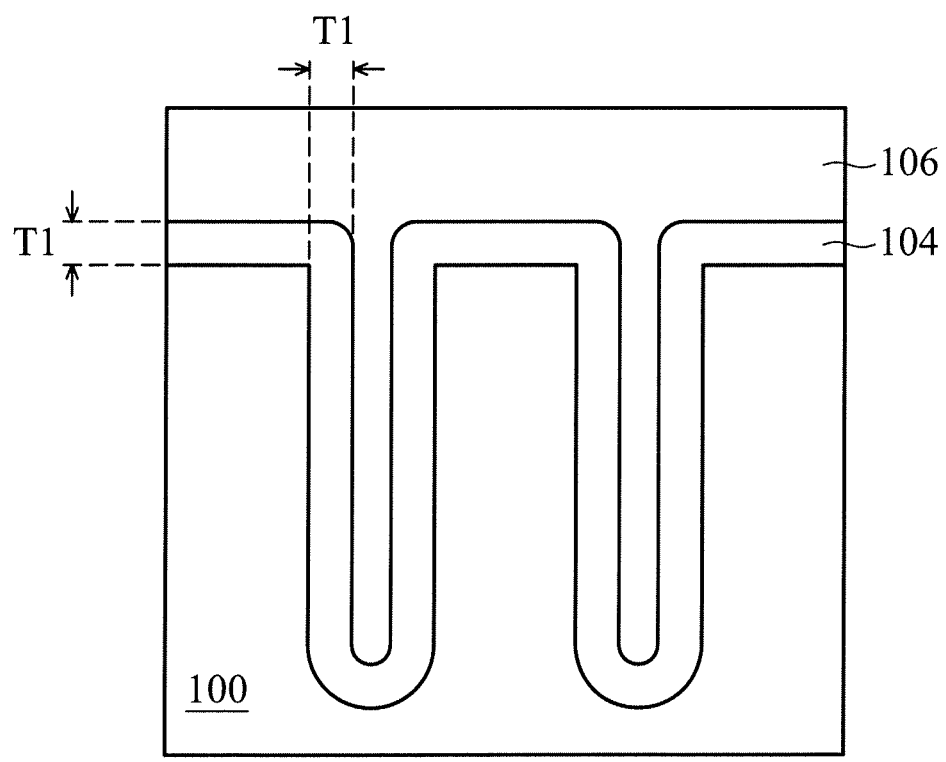
FIG. 2 illustrates a schematic cross-sectional view of a semiconductor device during the process according to one embodiment of the present invention.

Next, as shown in FIG. 2, according to some embodiments, an isolation oxide layer 104 is formed in the trenches 102 and on the substrate 100. In some embodiments, the isolation oxide layer 104 may be conformally formed on the sidewalls and bottom of the trenches 102 and on the top surface of the substrate 100 using, for example, a thermal oxidation process, or other suitable deposition processes. The thickness T1 of the isolation oxide layer 104 may be adjusted according to the device size and design requirements of the semiconductor device. In some embodiments, the thickness T1 of the isolation oxide layer 104 on the sidewalls and the bottom of the trenches 102 and the top surface of the substrate 100 may be, for example, between 70 nm and 150 nm.

As shown in FIG. 2, according to some embodiments, a shield polysilicon 106 is deposited in the trenches 102 and on the isolation oxide layer 104 on the substrate 100. In some embodiments, the shield polysilicon 106 may be filled in the trenches 102 and deposited on the isolation oxide layer 104 on the substrate 100 using, for example, chemical vapor deposition (CVD) or other suitable polysilicon deposition techniques. In some embodiments, the shield polysilicon 106 may be formed of undoped polysilicon or in-situ doped polysilicon.

Figure 3:
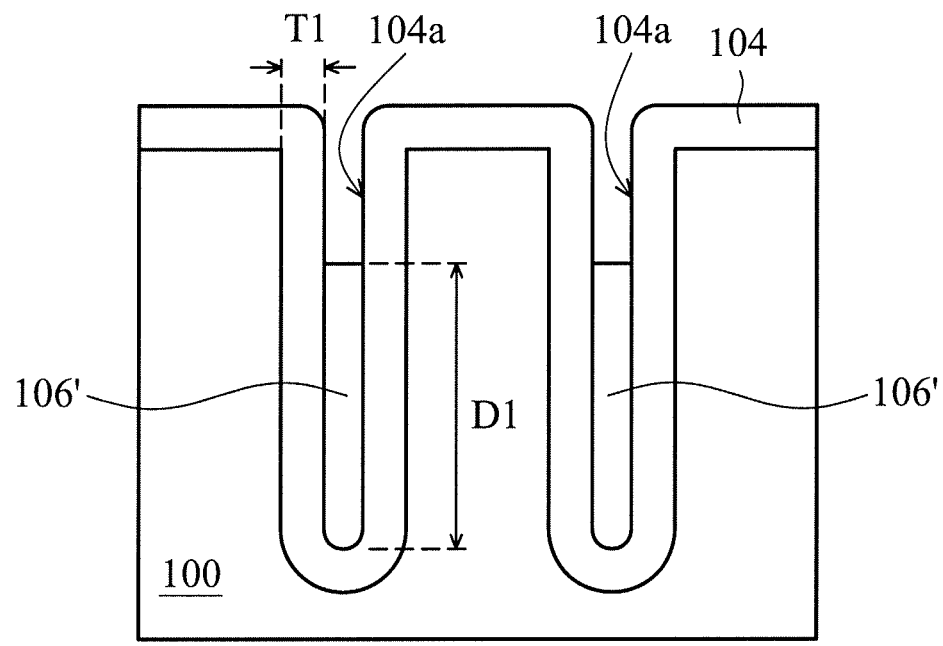
FIG. 3 illustrates a schematic cross-sectional view of a semiconductor device during the process according to one embodiment of the present invention.

As shown in FIG. 3, according to some embodiments, a first etching process is performed to remove the first portion of the shield polysilicon 106 and expose a portion of the surface 104a of the isolation oxide layer 104 in the trenches 102. In some embodiments, the first etching process may include, for example, an etchback process. In some embodiments, by removing the first portion of the shield polysilicon 106, the shield polysilicon 106 may be recessed into the trench 102 until the desired depth is reached. For example, as shown in FIG. 3, in an embodiment, the top surface of the shield polysilicon 106' may be lower than the top surface of the substrate 100. The surface 104a is a portion of the surface of the isolation oxide layer 104 formed on the sidewall of the trenches 102, exposed by removing the first portion of the shield polysilicon 106. In some embodiments, the shield polysilicon 106' removed by a first portion in the trench has a depth D1, as shown in FIG. 3. It should be noted that in some embodiments, the depth D1 of the shield polysilicon 106' is not the depth required for the shield polysilicon in the final semiconductor device. In some embodiments, the depth D1 of the shield polysilicon 106' is greater than the depth required for the shield polysilicon in the final semiconductor device.

In some embodiments, a chemical planarization process, such as chemical mechanical planarization polishing (CMP), may be performed on the shield polysilicon 106 before the first etching process is performed to remove the first portion of the shield polysilicon 106 until the isolation oxide layer 104 is exposed. Alternatively, in some embodiments, the step of the chemical mechanical planarization polishing (CMP) process described above may be omitted, and the aforementioned first etching process may be directly performed, so that the shield polysilicon 106 is recessed into the trench 102 until the desired depth is reached.

Figure 4:
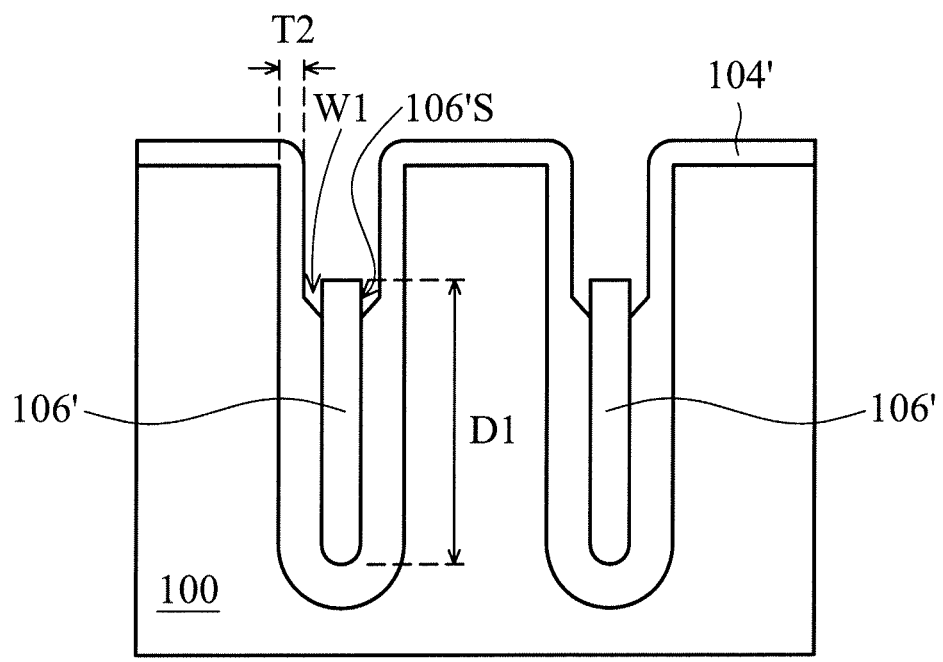
FIG. 4 illustrates a schematic cross-sectional view of a semiconductor device during the process according to one embodiment of the present invention.

As shown in FIG. 4, according to some embodiments, a first removal process is performed to remove the first portion of the isolation oxide layer 104. In some embodiments, the first removal process may include, for example, a wet etching process, an oxidative etching process, or other suitable processes. In some embodiments, after the first removal process, the first portion-removed isolation oxide layer 104' exposed by the trenches 102 (corresponding to the portion having the surface 104a shown in FIG. 3) has a thinner thickness T2, as shown in FIG. 4. In some embodiments, after the first removal process, the isolation oxide layer 104' on the substrate 100 also has a thinner thickness T2. In some embodiments, the thickness T2 is less than the thickness T1. In some embodiments, after the first removal process, the first portion-removed isolation oxide layer 104' forms a recessed portion W1 adjacent to the shield polysilicon 106', and a portion of the sidewall 106'S of the shield polysilicon 106' is exposed. As shown in FIG. 4, in some embodiments, the recessed portion W1 extends between the sidewalls of the shield polysilicon 106' and the isolation oxide layer 104' having a thickness T2.

Although the recessed portion W1 shown in FIG. 4 has a flat upper surface, it can be understood that the drawing shown in FIG. 4 is only an example. In some embodiments, upper surface of the recessed portion W1 of the isolation oxide layer 104' may have a concave radian.

Figure 5:
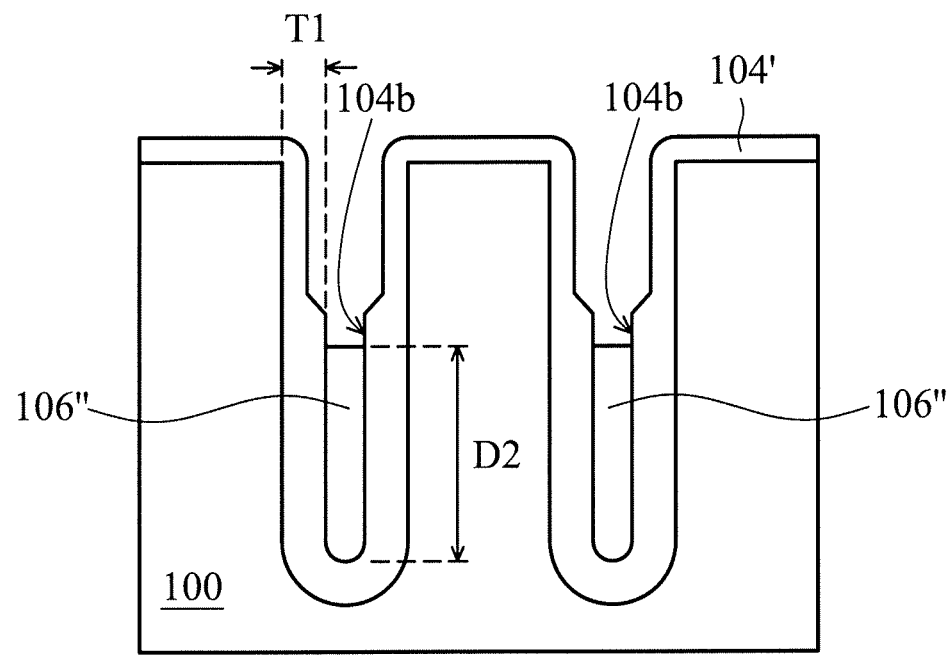
FIG. 5 illustrates a schematic cross-sectional view of a semiconductor device during the process according to one embodiment of the present invention.

As shown in FIG. 5, according to some embodiments, a second etching process is performed to remove the second portion of the shield polysilicon 106 and expose another portion of the surface 104b of the isolation oxide layer 104 in the trenches 102. In some embodiments, the first etching process may include, for example, an etchback process. In some embodiments, by removing the second portion of the shield polysilicon 106, the shield polysilicon 106 may be further recessed into the trenches 102 until the desired depth is reached. For example, as shown in FIG. 5, in one embodiment, the top surface of the shield polysilicon 106" may be lower than the top surface of the recessed portion W1 of the isolation oxide layer 104". The surface 104b is another portion of the surface of the isolation oxide layer 104 formed on the sidewall of the trenches 102 and is exposed by the second portion-removed shield polysilicon 106. In some embodiments, the second portion-removed shield polysilicon 106 has a depth D2 in the trench 102, as shown in FIG. 5. It should be noted that, in some embodiments, the depth D2 of the shield polysilicon 106" is the depth needed by the shield polysilicon in the final semiconductor device. In some embodiments, depth D2 is less than depth D1.

As shown in FIG. 5, the portion of the isolation oxide layer 104 that is exposed in the trenches 102 through the second etching process (i.e., the portion having the surface 104b) is protected by the shield polysilicon 106' during the first removal process and therefore is not removed. Therefore, after the second etching process, the portion of the isolation oxide layer 104' having the surface 104b still has the same thickness as the thickness T1. That is, because the shield polysilicon 106 is subjected to a two-step etching process (a first etching process and a second etching process) in the embodiment of the present invention, during the first removal process of the isolation oxide layer 104, a portion of the isolation oxide layer 104 may be protected by the shield polysilicon 106' having a depth D1 after the first etching process, so that the original thickness T1 is retained. Therefore, after the second etching process, the isolation oxide layer 104' exposed in the trenches 102 has different thicknesses (T1 and T2), and in this state (as shown in FIG. 5), the subsequent second removal process is performed.

Figure 6:
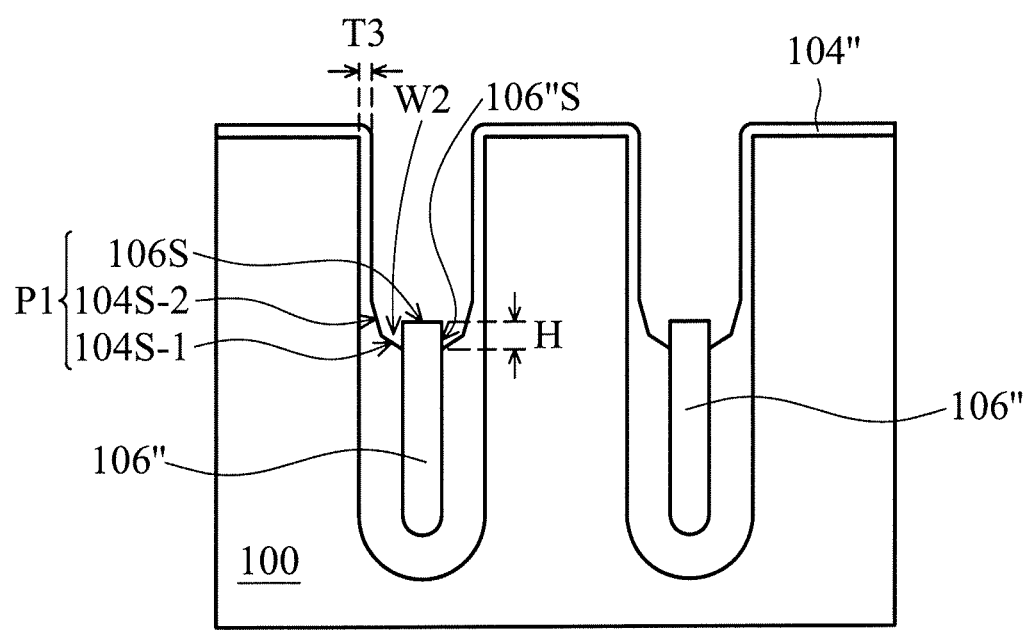
FIG. 6 illustrates a schematic cross-sectional view of a semiconductor device during the process according to one embodiment of the present invention.

As shown in FIG. 6, according to some embodiments, a second removal process is performed to remove the second portion of the isolation oxide layer 104. In some embodiments, the second removal process may include, for example, a wet etching process, an oxidative etching process, or other suitable processes. In some embodiments, the second removal process may be the same as the first removal process. In some embodiments, the second removal process may be different from the first removal process. The first removal process and the second removal process used may be selected and adjusted according to different process conditions such as the device size of the semiconductor device and the depth of the polysilicon in the two-step etching process or other process conditions. It should be noted that the final top surface profile of the isolation oxide layer can be determined by controlling the conditions of the first removal process and the second removal process, thereby affecting the top surface profile of the inter-poly oxide layer 108' in the final semiconductor device 10.

As shown in FIG. 6, in some embodiments, after the second removal process, the second portion-removed isolation oxide layer 104" (sometimes referred in the present specification as the remaining isolation oxide layer 104") exposed by trenches 102 (substantially corresponding to the portion having the surface 104a shown in FIG. 3) has a thinner thickness T3. In some embodiments, after the second removal process, the remaining isolation oxide layer 104" on the substrate 100 also has a thinner thickness T3. In some embodiments, thickness T3 is less than thickness T2. In other embodiments, after the second removal process, the portion of the isolation oxide layer 104' corresponding to the portion having the surface 104a shown in FIG. 3 may also be completely removed, and the isolation oxide layer 104' on the substrate 100 may be also be completely removed.

As shown in FIG. 6, in some embodiments, after the second removal process, the second portion-removed isolation oxide layer 104" further forms another recessed portion W2 in the region adjacent to the shield polysilicon 106" and exposes a portion of sidewall 106"S of the shield polysilicon 106". As shown in FIG. 6, in some embodiments, the recessed portion W2 extends between the sidewalls of the shield polysilicon 106" and the isolation oxide layer 104" having the thickness T3.

It should be noted that, during the second removal process, since the protected isolated isolation oxide layer 104" described in FIG. 5 (the portion having the surface 104b) still has the same thickness as the thickness T1, the degree of recess of the isolation oxide layer 104" caused by the second removal process will be reduced. As shown in FIG. 6, in some embodiments, after the second removal process is performed to remove the second portion of the isolation oxide layer 104, the top surface of the remaining isolation oxide layer 104" is substantially extends gently upwards from the sidewall of the shield polysilicon 106 to the sidewall of the trench 102. In some embodiments, the recessed portion W2 formed after the second removal process has a top surface that is not smooth (or is discontinuous).

As shown in FIG. 6, in some embodiments, the top surface 104S of the recessed portion W2 formed after the second removal process may be formed by first top surface portion 104S-1 and the second top surface portion 104S-2. Although the first top surface portion 104S-1 and the second top surface portion 104S-2 of the recessed portion W2 shown in FIG. 6 are flat surfaces, it can be understood that the figure shown in FIG. 6 is only an example, in some embodiments, the first top surface portion 104S-1 and the second top surface portion 104S-2 of the recessed portion W2 of the isolation oxide layer 104" may have a concave curvature, respectively.

More specifically, as shown in FIG. 6, in some embodiments, after the second removal process is performed to remove the second portion of the isolation oxide layer 104, the first top surface portion 104S-1 of the remaining isolation oxide layer 104" adjacent to the sidewall of the shield polysilicon 106" has a first curvature, while the second top surface portion 104S-2 of the remaining isolation oxide layer 104" adjacent to the sidewall of the trench 102 has a second curvature. In some embodiments, the first curvature is different from the second curvature. In some embodiments, the first curvature is greater than the second curvature. In some embodiments, the first curvature may be, for example, between 0.06 and 0.1 $nm^{-1}$. In some embodiments, the second curvature may be, for example, between 0.02 and 0.025 $nm^{-1}$.

As shown in FIG. 6, in some embodiments, after the second removal process is performed to remove the second portion of the isolation oxide layer 104, the height difference H between the lowest point of the top surface portion 104S-1 of the remaining isolation oxide layer 104" adjacent to the shield polysilicon 106' and the top surface 106S of the remaining shield polysilicon 106" may be less than the thickness T1 of the isolation oxide layer 104 over the substrate 100 as shown in FIG. 2.

It is worth mentioning that such a small height difference comes from the results of the improvement of the process provided by the present invention. In the past, in order to remove the isolation oxide layer disposed on the sidewall of the trench and on the substrate, the isolation oxide layer is usually over-etched in the past process, thereby forming a significant recess in the isolation oxide layer between the sidewall of the shield polysilicon and the sidewall of the trench. As a result, a significant difference height is formed between the isolation oxide layer and the top surface of the shield polysilicon. However, because the embodiment of the present invention performs a two-step etching process on the shield polysilicon and performs a two-stage removal process on the isolation oxide layer, the degree of recess of the isolation oxide generated between the sidewall of the shield polysilicon and the sidewall of the trench can be reduced. Also, the height difference between the isolation oxide layer and the top surface of the shield polysilicon is also reduced. As a result, the inter-poly oxide that are filled into trenches 102 in the subsequent processes does not generate (or substantially does not generate) voids. Since the inter-poly oxide can be well deposited, the formation of the inter-poly oxide layer can be better controlled and the performance of the final semiconductor device can be improved.

As shown in FIG. 6, in some embodiments, after a second removal process is performed to remove the second portion of the isolation oxide layer 104, the first top surface portion 104S-1 and the second top surface portion 104S-2 of the remaining isolation oxide layer 104" and the top surface 106S of the shield polysilicon 106" constitute the profile P1. In some embodiments, the profile P1 can be substantially regarded as a concave curve.

Figure 7:
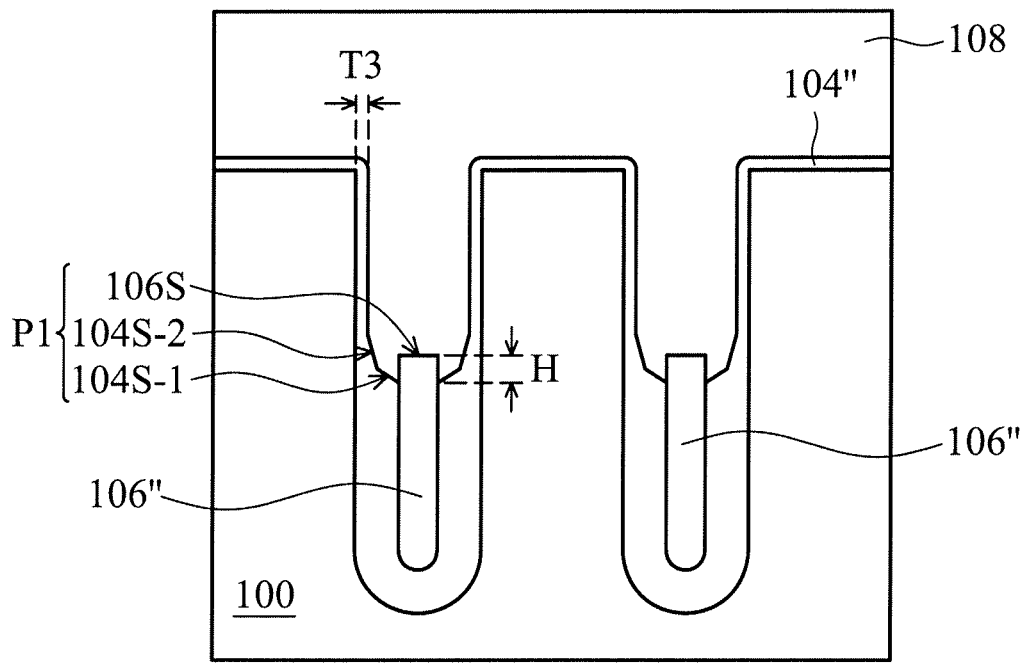
FIG. 7 illustrates a schematic cross-sectional view of a semiconductor device during the process according to one embodiment of the present invention.

As shown in FIG. 7, according to some embodiments, an inter-poly oxide 108 is deposited in the trench 102 and over the substrate 100. In some embodiments, the inter-poly oxide 108 may be deposited using, for example, high density plasma chemical vapor deposition (HDPCVD) or other suitable deposition processes. As described above, in some embodiments, the inter-poly oxide 108 may completely cover the isolation oxide layer 104 and the shield polysilicon 106 without producing (or substantially not producing) voids. Such result is advantageous to improve the control of the thickness and quality of the inter-layer oxide layer and the performance of the final semiconductor device, for example, reducing the gate-to-drain capacitance (Cgd) and suppressing the gate-to-source leakage current.

Figure 8:
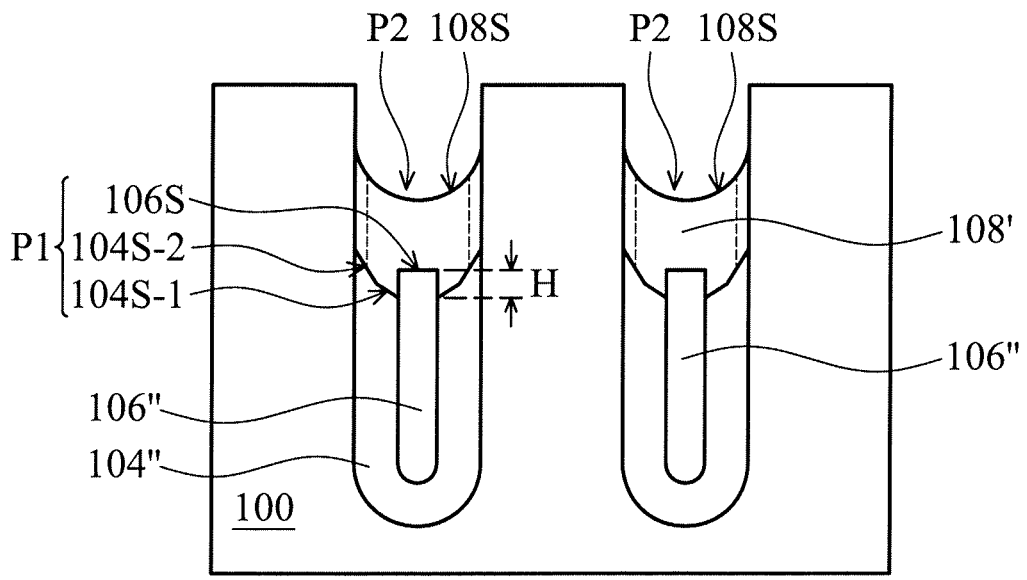
FIG. 8 illustrates a schematic cross-sectional view of a semiconductor device during the process according to one embodiment of the present invention.

As shown in FIG. 8, according to some embodiments, a third etching process is performed to remove a portion of the inter-poly oxide 108 and expose a portion of the sidewall of the trench 102. In some embodiments, the third etching process may include, for example, a dry etching process, a wet etching process, an etchback process, other suitable etching processes, or a combination thereof. As shown in FIG. 8, in some embodiments, the inter-poly oxide 108 may be etched to a target depth using, for example, an etchback process to form an inter-poly oxide layer 108' on the remaining shield polysilicon 106" and on the remaining isolation oxide layer 104". For example, as shown in FIG. 8, in one embodiment, the top surface 108S of the inter-poly oxide layer 108' may be lower than the top surface of the substrate 100. In some embodiments, after the third etching process, the remaining isolation oxide layer 104" disposed on the sidewall of the trench 102 and on the substrate 100 can be completely removed together. In some embodiments, the inter-poly oxide layer 108' can be used to electrically insulate the shield polysilicon 106" from the subsequently formed gate polysilicon. In some embodiments, the average thickness of the inter-poly oxide layer 108' may be, for example, between 90 nm and 170 nm.

According to some embodiments, FIG. 8 shows a cross-sectional view of the semiconductor device, in which the portion of the isolation oxide layer 104' exposed to the trench 102 (substantially corresponding to the portion having the surface 104a shown in FIG. 3) and the isolation oxide layer 104' disposed on the substrate 100 are completely removed after the second removal process shown in FIG. 6. In other embodiments, FIG. 8 also shows a cross-sectional view of the semiconductor device, in which the portion of the remaining isolation oxide layer 104" exposed to the trench 102 (substantially corresponding to the portion having the surface 104a shown in FIG. 3) having a thinner thickness T3 (shown by a dashed line) after the second removal process shown in FIG. 6. However, for the purpose of simplicity and clarity, the dotted line is omitted in the description of FIG. 9 and FIG. 10.

It should be noted that, as shown in FIG. 8, according to some embodiments, the top surface of inter-poly oxide layer 108' is a concave top surface 108S. The concave top surface 108S has a profile P2. In some embodiments, the profile P2 may be regarded as having a concave curve and exhibit an upwardly curved arc near the sidewall of the trench 102. As shown in FIG. 8, in some embodiments, the profile P2 of the concave top surface 108S of the inter-poly oxide layer 108' and the profile P2 formed by the first top surface portion 104S-1, the second top surface portion 104S-2, and the top surface 106S of the remaining isolation oxide layer 104" is substantially the same. That is, in some embodiments, the profile P2 and the profile P1 are substantially the same, and can be regarded as having substantially the same concave curve.

In some embodiments, the angle between the concave top surface 108S of the inter-poly oxide layer 108' and the sidewall of the trench 102 may be, for example, between 110° and 120°. In some embodiments, the curvature of the concave top surface 108S of the inter-poly oxide layer 108' may be, for example, between 0.045 and 0.055 $nm^{-1}$. In some embodiments, the curvature of the concave top surface 108S is the curvature of the profile P2. In some embodiments, the curvature of profile P2 is substantially equal to the curvature of profile P1. In some embodiments, the larger the angle between the concave top surface 108S of the inter-poly oxide layer 108' and the sidewall of the trench 102, the greater the curvature of the concave top surface 108S of the inter-poly oxide layer 108' and the larger the gate-to-drain capacitance (Cgd) of the semiconductor device is reduced.

According to an embodiment, in the case that the angle between the concave top surface 108S of the inter-poly oxide layer 108' and the sidewall of the trench 102 of the semiconductor device 10 provided by the disclosed embodiment is 120°, and the curvature of the top surface 108S of the inter-poly oxide layer 108' (i.e. the curvature of the profile P2) is 120°, the gate-to-drain capacitance (Cgd) of the semiconductor device 10 is between 2.5E-9 and 3E-9 coulomb.

It is worth mentioning that since the concave top surface 108S of the inter-poly oxide layer 108' exhibits an upwardly curved arc near the sidewall of the trench 102, it corresponds to an increase of the thickness of the oxide layer (for example, the inter-poly oxide layer 108' and the remaining isolation oxide layer 104") subsequently formed between the gate polysilicon and the drain. Therefore, the gate-to-drain capacitance (Cgd) of the final semiconductor device can be reduced.

In some embodiments, the height difference between the highest point of the second top surface portion 104S-2 of the remaining isolation oxide layer 104" adjacent to the trench 102 and the lowest point of the first top surface portion 104S-1 of the remaining isolation oxide layer 104" adjacent to the shield polysilicon 106" may be, for example, between 30 nm and 40 nm. In some embodiments, the height difference between the highest point of the concave top surface 108S of the inter-poly oxide layer 108' and the lowest point of the concave top surface 108S of the inter-poly oxide layer 108' may be, for example, between 32 nm and 38 nm.

Figure 9:
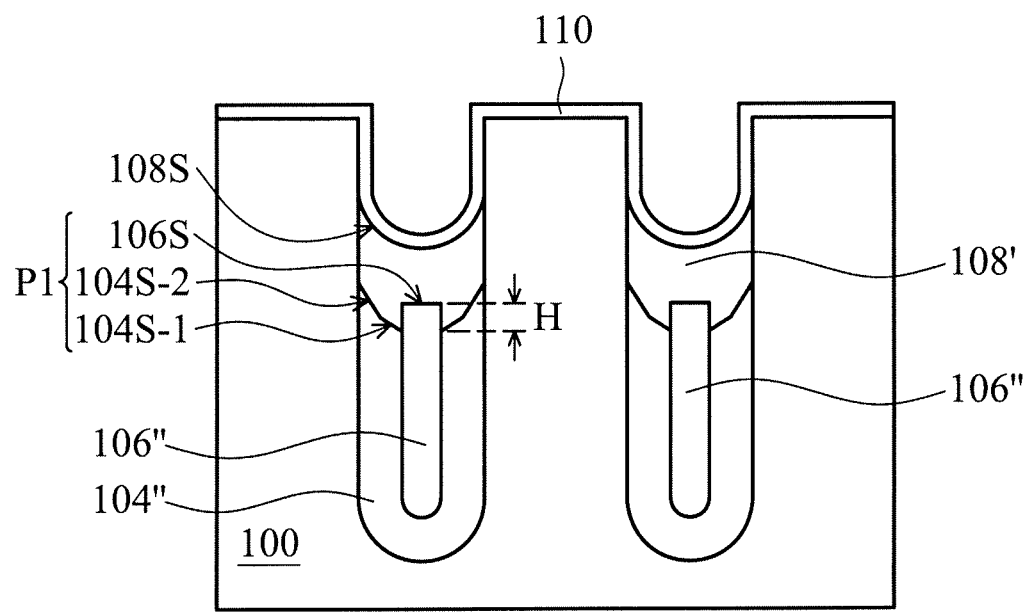
FIG. 9 illustrates a schematic cross-sectional view of a semiconductor device during the process according to one embodiment of the present invention.

As shown in FIG. 9, according to some embodiments, a gate oxide layer 110 is formed on the inter-poly oxide layer 108'. In some embodiments, for example, a chemical vapor deposition (CVD) process, an atomic layer deposition (ALD) process, a thermal oxidation process, a physical vapor deposition (PVD) process, a lithography patterning process, an etching process, others applicable process, or a combination thereof may be used to form the gate oxide layer 110. In some embodiments, the gate oxide layer 110 may be formed of silicon oxide ($SiO_2$), hafnium oxide ($HfO_2$), zirconium oxide ($ZrO_2$), aluminum oxide ($Al_2O_3$), alloy of aluminium oxide and hafnium, HfSiO, HfSiON, HfTaO, HfTiO, HfZrO, other suitable high-k dielectric materials, or a combination thereof.

Figure 10:
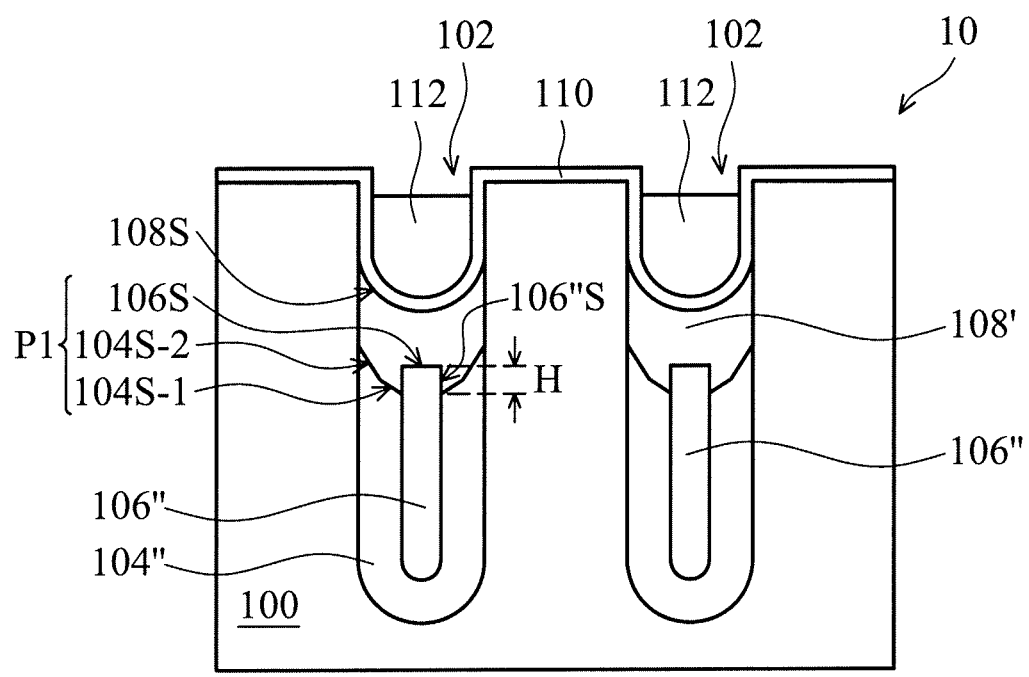
FIG. 10 illustrates a schematic cross-sectional view of a semiconductor device during the process according to one embodiment of the present invention.

As shown in FIG. 10, according to some embodiments, a gate polysilicon 112 is formed on the gate oxide layer 110. In some embodiments, the gate polysilicon 112 may be formed using, for example, chemical vapor deposition (CVD) process or other suitable polysilicon deposition techniques.

Next, the subsequent steps may be performed according to techniques well known to those skilled in the art. For example, insulating layers such as boron phosphosilicate glass (BPSG), phosphosilicate glass (PSG), or borosilicate glass (BSG) may be formed over the semiconductor device 10 by using, for example, chemical vapor deposition (CVD) or other suitable deposition process. Also, a process such as forming a metal layer may be performed. For the purpose of simplicity and clarity, it is not described again.

Another embodiment of the present invention provides a semiconductor device formed by the aforementioned method for forming the semiconductor device. As shown in FIG. 10, the semiconductor device 10 includes a substrate 100 having a plurality of trenches 102, and an isolation oxide layer 104" disposed in the trenches 102. The material of the substrate 100 can be referred to the aforementioned related paragraphs, and will not be repeated again. In some embodiments, the isolation oxide layer 104" may be conformally formed on the sidewalls and bottom of the trenches 102 and on the top surface of the substrate 100.

In some embodiments, the semiconductor device 10 also includes a shield polysilicon 106". In some embodiments, the shield polysilicon 106" may be formed of an undoped polysilicon or an in-situ doped polysilicon. In some embodiments, the shield polysilicon 106" is disposed in the trench 102 and partially surrounded by the isolation oxide layer 104".

In some embodiments, a top surface of the isolation oxide layer 104" extends upwardly from the sidewall 106"S of the shield polysilicon 106" to the sidewall of the trench 102. In some embodiments, a top surface of isolation oxide layer 104" has two different curvatures. In some embodiments, the first top surface portion 104S-1 of the isolation oxide layer 104" adjacent to the sidewall 106"S of the shield polysilicon 106" has a first curvature, and the second top surface portion 104S-2 of the isolation oxide layer 104" adjacent to the sidewall of the trench 102 has a second curvature. In some embodiments, the first curvature is greater than the second curvature. In some embodiments, the isolation oxide layer 104" has a top surface that is not smooth (or is discontinuous).

In some embodiments, the height difference between the first top surface portion 104S-1 of the isolation oxide layer 104" adjacent to the shield polysilicon 106" and the top surface 106S of the shield polysilicon 106" is less than 50 nm. As a result, the inter-poly oxide filled into trenches 102 in the subsequent process does not generate (or substantially does not generate) voids. Since the inter-poly oxide can be well deposited, the formation of the inter-poly oxide layer can be better controlled and the performance of the final semiconductor device can be improved, such as reducing the gate-to-drain capacitance (Cgd) and suppressing the gate-to-source leakage current.

In some embodiments, the height difference between the highest point of the second top surface portion 104S-2 of the isolation oxide layer 104" adjacent to the trench 102 and the lowest of the first top surface portion 104S-1 of the isolation oxide layer 104" adjacent to the shield polysilicon 106" may be, for example, between 30 nm and 40 nm.

In some embodiments, the semiconductor device 10 further includes an inter-poly oxide layer 108'. In some embodiments, the inter-poly oxide layer 108' may be, for example, a high density plasma chemical vapor deposition (HDP-CVD) oxide. The inter-poly oxide layer 108" is disposed on the isolation oxide layer 104" and the shield polysilicon 106". In some embodiments, the inter-poly oxide layer 108' completely covers the isolation oxide layer 104" and the shield polysilicon 106" without (or substantially without) having voids. The inter-poly oxide layer 108' has a concave top surface 108S.

In some embodiments, the profile of the concave top surface 108S of the inter-poly oxide layer 108' is substantially the same as the profile P1 formed by the top surface of the isolation oxide layer 104" (the first top surface portion 104S-1 and the second top surface portion 104S-2) and a top surface 106S of the shield polysilicon 106".

It should be noted that since the concave top surface 108S of the inter-poly oxide layer 108' exhibits an upwardly curved arc near the sidewall of the trench 102, it corresponds to an increase of the thickness of the oxide layer (for example, the inter-poly oxide layer 108' and the remaining isolation oxide layer 104") subsequently formed between the gate polysilicon and the drain. Therefore, the gate-to-drain capacitance (Cgd) of the final semiconductor device can be reduced. In some embodiments, the average thickness of the inter-poly oxide layer 108' may be, for example, between 90 nm and 170 nm.

In some embodiments, the angle between the concave top surface 108S of the inter-poly oxide layer 108' and the sidewall of the trench 102 may be, for example, between 110○ and 120○. In some embodiments, the curvature of the concave top surface 108S of the inter-poly oxide layer 108' may be, for example, between 0.045 and 0.055 $nm^{-1}$. In some embodiments, the greater the angle between the concave top surface 108S of the inter-poly oxide layer 108' and the sidewall of the trench 102, the greater the curvature of the concave top surface 108S of the inter-poly oxide layer 108' and the larger the gate-to-drain capacitance (Cgd) of the semiconductor device is reduced.

In some embodiments, the semiconductor device 10 further includes a gate oxide layer 110 disposed on the inter-poly oxide layer 108', and a gate polysilicon 112 disposed on the gate oxide layer 110. The materials of the gate oxide layer 110 and the gate polysilicon 112 may refer to the aforementioned related paragraphs, and will not be repeated again. It can be understood that the semiconductor device 10 may also include other elements not shown in the figures, for example, insulating layers (such as borophosphosilicate glass (BPSG), phosphosilicate glass (PSG), or borosilicate glass (BSG)) disposed over the semiconductor device 10 and structures such as metal layers. Since the above structures are well known to those skilled in the art, they are not described again for the purpose of simplicity and clarity.

The method for forming a semiconductor device provided by the embodiments of the present invention performs a two-step etching process on the shield oxide and performs a two-stage removal process on the isolation oxide layer to reduce the degree of recess of the isolation oxide generated between the sidewall of trench and the sidewall of shield oxide in the past process, so that the inter-poly oxide filled in the subsequent process can be well deposited on the shield polysilicon and the isolation oxide layer without generating voids.

The semiconductor device obtained by the method provided by the embodiments of the present invention has the following advantages. Compared to the semiconductor device provided in the past, the semiconductor device provided by the embodiments of the present invention can reduce the degree of recess of the isolation oxide layer generated between the sidewall of the trench and the sidewall of the shield polysilicon, and the inter-poly oxide (IPO) layer filled in the subsequent process does not have voids. Therefore, the inter-poly oxide (IPO) layer of the semiconductor device in the embodiments of the present invention can provide good electrical insulation between the gate polysilicon and the shield polysilicon. Also, since there is no void, the inter-poly oxide (IPO) layer can provide excellent isolation to inhibit gate-to-source leakage current, improving the performance of the semiconductor device.

In addition, since the two-step etching process is performed on the shield oxide and the two-step removal process is performed on the isolation oxide layer, the recess portion of the isolation oxide layer between the sidewall of the trench and the sidewall of the shield polysilicon of the semiconductor device provided by the embodiments of the present invention has an improved profile. Furthermore, since the profile of the inter-poly oxide (IPO) layer is substantially the same as the profile of the recessed portion of the aforementioned isolation oxide layer of the semiconductor device provided by the embodiments of the present invention, the inter-poly oxide (IPO) layer of the semiconductor device provided by the embodiments of the present invention has a concave top surface. The concave top surface of the inter-poly oxide (IPO) layer exhibits an upwardly curved arc near the sidewall of the trench, which corresponds to an increase in the thickness of the oxide layer between the gate polysilicon and the drain, thereby reducing the gate-to-drain capacitance (Cgd).

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for forming a semiconductor device, comprising:
   providing a substrate;
   forming a plurality of trenches in the substrate;
   forming an isolation oxide layer in the trenches and on the substrate;
   depositing a shield polysilicon in the trenches and on the isolation oxide layer on the substrate;
   performing a first etching process to remove a first portion of the shield polysilicon and expose a portion of the surface of the isolation oxide layer in the trenches;
   performing a first removal process to remove a first portion of the isolation oxide layer;
   performing a second etching process to remove a second portion of the shield polysilicon and expose another portion of the surface of the isolation oxide layer in the trenches;
   performing a second removal process to remove a second portion of the isolation oxide layer; and
   forming an inter-poly oxide layer on the remaining shield polysilicon and the remaining isolation oxide layer;
   wherein the inter-poly oxide layer has a concave top surface.

2. The method for forming a semiconductor device as claimed in claim 1, further comprising:
   forming a gate oxide layer on the inter-poly oxide layer; and
   forming a gate polysilicon on the gate oxide layer.

3. The method for forming a semiconductor device as claimed in claim 1, wherein forming the inter-poly oxide layer on the remaining shield polysilicon and the remaining isolation oxide layer comprises:
   depositing an inter-poly oxide in the trenches and over the substrate; and
   performing a third etching process to remove a portion of the inter-poly oxide and expose a portion of the sidewall of the trenches.

4. The method for forming a semiconductor device as claimed in claim 3, wherein the inter-poly oxide completely covers the isolation oxide layer and the shield polysilicon.

5. The method for forming a semiconductor device as claimed in claim 1, further comprising:
   before performing the first etching process to remove the first portion of the shield polysilicon, performing a chemical mechanical planarization polishing (CMP) process to the shield polysilicon until the isolation oxide layer is exposed.

6. The method for forming a semiconductor device as claimed in claim 1, wherein after performing the second etching process to remove the second portion of the shield polysilicon, a top surface of the remaining isolation oxide layer extends upward from the sidewall of the shield polysilicon towards the sidewall of the trench.

7. The method for forming a semiconductor device as claimed in claim 1, wherein after performing the second etching process to remove the second portion of the shield polysilicon, the first top surface portion of the remaining isolation oxide layer adjacent to the sidewall of the shield polysilicon has a first curvature, and the second top surface portion of the remaining isolation oxide layer adjacent to the sidewall of the trench has a second curvature, wherein the first curvature is greater than the second curvature.

8. The method for forming a semiconductor device as claimed in claim 1, wherein the profile of the concave top surface of the inter-poly oxide layer is substantially the same as the profile formed by the top surface of the remaining isolation oxide layer and the top surface of the remaining shield polysilicon.

9. The method for forming a semiconductor device as claimed in claim 1, wherein the height difference between the lowest point of a first top surface portion of the remaining isolation oxide layer adjacent to the shield polysilicon and a top surface of the remaining shield polysilicon is less than a thickness of the isolation oxide layer on the substrate.

10. The method for forming a semiconductor device as claimed in claim 1, wherein the angle between the concave top surface of the inter-poly oxide layer and the sidewall of the trench is between 110∘ and 120∘ and/or the curvature of the concave top surface of the inter-poly oxide layer is between 0.045 and 0.055 $nm^{-1}$.

* * * * *